United States Patent
Li et al.

(10) Patent No.: US 10,374,389 B2
(45) Date of Patent: *Aug. 6, 2019

(54) PLASMONIC MODE III-V LASER AS ON-CHIP LIGHT SOURCE

(71) Applicants: INTERNATIONAL BUSINESS MACHINES CORPORATION, Armonk, NY (US); The George Washington University, Washington, DC (US)

(72) Inventors: Ning Li, White Plains, NY (US); Ke Liu, Arlington, VA (US); Devendra K. Sadana, Pleasantville, NY (US); Volker J. Sorger, Alexandria, VA (US)

(73) Assignees: International Business Machines Corporation, Armonk, NY (US); The George Washington University, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/474,534

(22) Filed: Mar. 30, 2017

(65) Prior Publication Data

US 2018/0269652 A1    Sep. 20, 2018

Related U.S. Application Data

(63) Continuation of application No. 14/941,100, filed on Nov. 13, 2015, now Pat. No. 9,667,032.

(51) Int. Cl.
*G02B 6/12* (2006.01)
*G02B 6/43* (2006.01)
(Continued)

(52) U.S. Cl.
CPC ........ *H01S 5/0425* (2013.01); *G02B 6/12002* (2013.01); *G02B 6/136* (2013.01);
(Continued)

(58) Field of Classification Search
CPC ...... G02B 6/12; G02B 6/122; G02B 6/12002; G02B 6/43; H01L 2933/0016;
(Continued)

(56) References Cited

U.S. PATENT DOCUMENTS

| 9,667,032 B1 * | 5/2017 | Li | H01S 5/0425 |
| 9,935,236 B2 * | 4/2018 | Leobandung | H01L 33/06 |
| 2012/0043527 A1 * | 2/2012 | Ding | B82Y 10/00 |
| | | | 257/28 |

OTHER PUBLICATIONS

List of IBM Patents or Patent Applications Treated as Related dated Mar. 30, 2017, 2 pages.
(Continued)

*Primary Examiner* — Michael P Mooney
(74) *Attorney, Agent, or Firm* — Tutunjian & Bitetto, P.C.; Erik Johnson

(57) ABSTRACT

A plasmonic light source includes a substrate and a square nano-cavity formed on the substrate. The nano-cavity includes a quantum well structure. The quantum well structure includes III-V materials. A plasmonic metal is formed as an electrode on the square nano-cavity and is configured to excite surface plasmons with the quantum well structure to generate light. Complementary metal oxide semiconductor (CMOS) devices are formed on the substrate.

20 Claims, 4 Drawing Sheets

(51) Int. Cl.
  *H01S 5/02* (2006.01)
  *H01S 5/10* (2006.01)
  *H01S 5/34* (2006.01)
  *G02B 6/136* (2006.01)
  *H01S 5/026* (2006.01)
  *H01S 5/042* (2006.01)
  *H01S 5/343* (2006.01)

(52) U.S. Cl.
  CPC .............. *G02B 6/43* (2013.01); *H01S 5/1046* (2013.01); *H01S 5/34346* (2013.01); *H01S 5/021* (2013.01); *H01S 5/026* (2013.01); *H01S 5/1042* (2013.01); *H01S 5/3401* (2013.01)

(58) Field of Classification Search
  CPC ..... H01L 33/06; H01L 33/0062; H01L 33/10; H01L 33/24; H01L 33/30; H01L 33/40; H01S 5/026; H01S 5/0425; H01S 5/1039; H01S 5/1042; H01S 5/1046; H01S 5/22; H01S 5/343; H01S 5/34346
  USPC ...... 977/700, 701, 761; 372/43.01, 44.01, 6; 385/14, 39, 129–132; 438/22, 31
  See application file for complete search history.

(56) References Cited

OTHER PUBLICATIONS

Li, N. et al., "Monolithic III-V on Silicon Plasmonic Nanolaser Structure for Optical Interconnects" Scientific Reports (Sep. 2015) pp. 1-9, vol. 5, Article No. 14067.

\* cited by examiner

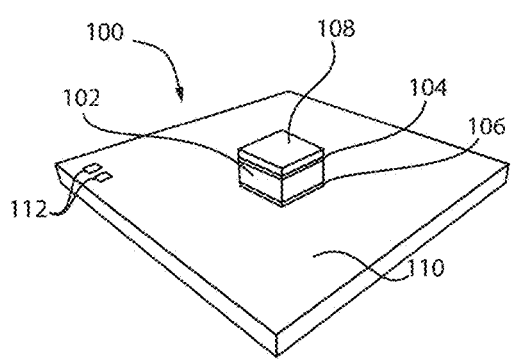
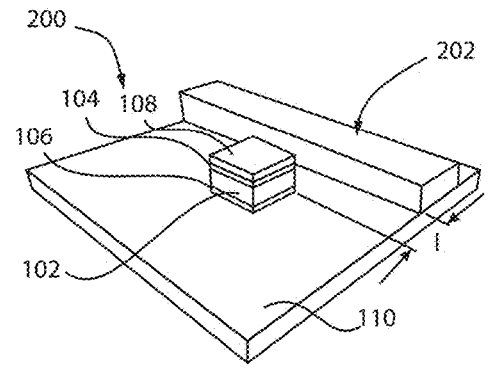
FIG. 1  FIG. 2
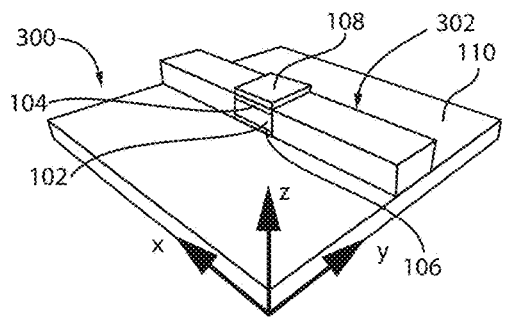
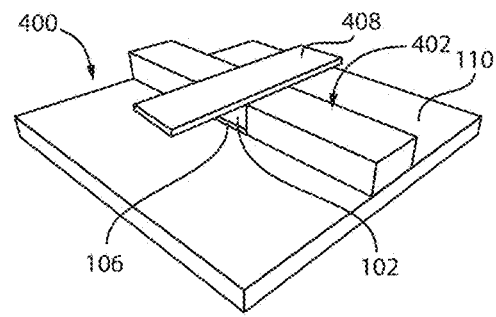
FIG. 3  FIG. 4
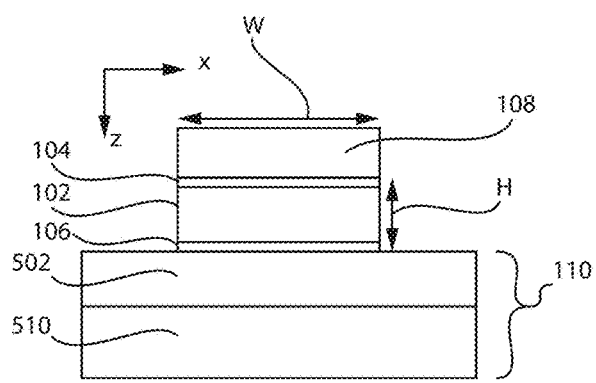
FIG. 5

PLASMONIC MODE III-V LASER AS ON-CHIP LIGHT SOURCE

STATEMENT REGARDING FEDERALLY SPONSORED RESEARCH OR DEVELOPMENT

This invention was made with Government support under contract number: FA 9559-14-1-0215 awarded by U.S. Air Force. The Government has certain rights in this invention.

BACKGROUND

Technical Field

The present invention relates to plasmonic lasers, and more particularly to nano-lasers formed on-chip to provide high speed modulation with less energy loss and a smaller footprint for high waveguide coupling efficiency.

Description of the Related Art

Optical devices are often formed on III-V substrates due to their high speed performance capabilities. Laser devices may be formed off-chip from Si substrates with field effect transistors. These off-chip designs suffer from high cost, slow speed, high energy consumption as well as a large foot print.

SUMMARY

A plasmonic light source includes a substrate and a square nano-cavity formed on the substrate. The nano-cavity includes a quantum well structure. The quantum well structure includes III-V materials. A plasmonic metal is formed as an electrode on the square nano-cavity and is configured to excite surface plasmons with the quantum well structure to generate light. Complementary metal oxide semiconductor (CMOS) devices are formed on the substrate.

Another plasmonic light source includes a silicon substrate, a dielectric layer formed on the silicon substrate and a square nano-cavity bonded to the dielectric layer. The nano-cavity includes a quantum well structure, and the quantum well structure includes III-V materials. A plasmonic metal is formed as an electrode on the square nano-cavity and is configured to excite surface plasmons with the quantum well structure to generate light. A waveguide is formed on the dielectric layer to couple light from the square nano-cavity. Complementary metal oxide semiconductor (CMOS) devices are formed in the silicon substrate.

A method for forming an on-chip plasmonic light source includes forming a quantum well structure on a III-V substrate configured for surface plasmon generation; forming an oxide on the quantum well structure; oxide wafer bonding the oxide on the quantum well structure with an oxide formed on a silicon substrate by oxide wafer bonding, the silicon substrate including complementary metal oxide semiconductor (CMOS) devices formed thereon; etching away the III-V substrate to transfer the quantum well structure to the silicon substrate; forming a plasmonic metal as an electrode on the quantum well structure; and patterning the quantum well structure to form a square nano-cavity light source on the silicon substrate.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 1 is a perspective view of a square plasmonic light source integrated on a substrate in accordance with the present principles;

FIG. 2 is a perspective view of a square plasmonic light source with an offset waveguide integrated on a substrate in accordance with the present principles;

FIG. 3 is a perspective view of a square plasmonic light source in-line with a waveguide in accordance with the present principles;

FIG. 4 is a perspective view of a square plasmonic light source in-line with a waveguide and including an extended plasmonic metal electrode in accordance with the present principles;

FIG. 5 is a cross-sectional view of a square plasmonic light source integrated on a silicon substrate in accordance with the present principles;

DETAILED DESCRIPTION

Figure 6:
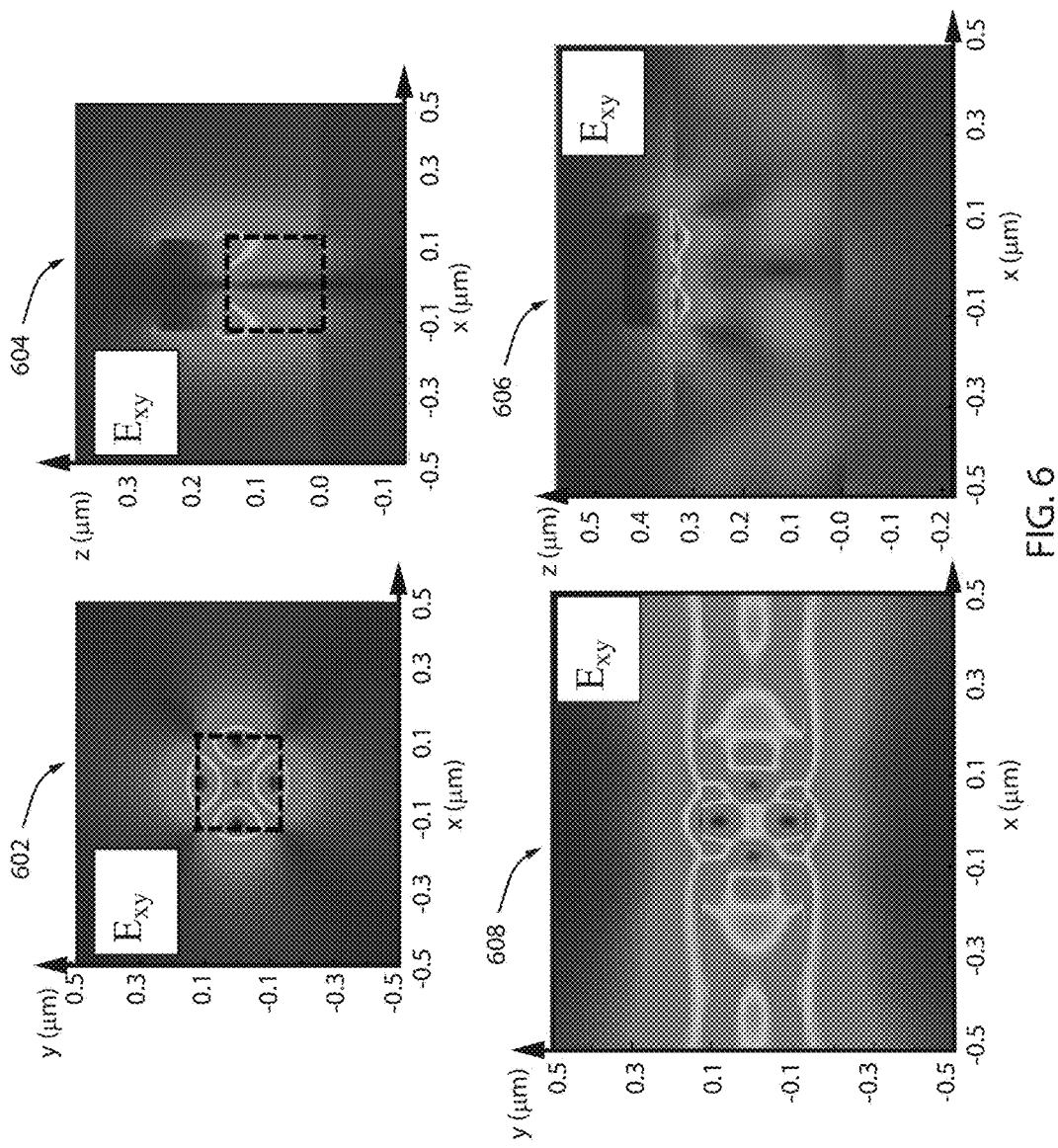
FIG. 6 shows intensity profiles for x, y and z coordinates (in microns) for square and in-line cavities indicating mode confinement by total internal reflection at cavity boundaries in accordance with the present principles.

In accordance with the present principles, devices and methods are provided for plasmonic lasers. In one embodiment, a plasmonic square cavity laser is provided to enhance modulation speed, reduce foot print, and increase light coupling efficiency into a waveguide. An on-chip light source results in less energy loss than for off-chip designs, e.g., 10-15 dB less energy needed for on-chip lasers. The on-chip laser can be a direct modulated laser with no external modulator needed. This reduces the device footprint along with other considerations. On-chip lasers can be very densely packed to provide lower packaging costs. With on-chip designs, a large number of inputs/outputs (I/Os) are available to satisfy higher bandwidth requirements. In addition, there is low parasitic capacitance for high speed applications.

The plasmonic square cavity laser may be formed using III-V materials and placed on IV substrates, such as Si, to enable the formation of additional circuits using complementary metal oxide semiconductor (CMOS) processing. In this way, the square cavity plasmonic mode is employed with III-V active materials and employed as an on-chip light source for optical interconnects. A plasmonic/photonic hybrid mode is employed for enhancing light coupling efficiency into a waveguide (also on-chip). The plasmonic/photonic hybrid mode includes employing plasmonic surface excitation to generate photons. The plasmonic square cavity laser achieves high speed modulation, low energy consumption, small foot print and high light coupling efficiency into waveguides. The plasmonic square cavity laser is also compatible with CMOS electronics and has suitable system architecture for on-chip optical interconnects and high performance computers.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., AlGaAs. These compounds include different proportions of the elements within the compound, e.g., AlGaAs includes $Al_x$, $Ga_{1-x}As$, where x is less than or equal to 1, etc. In addition, other elements may be included in the compound, such as, e.g., AlInGaAs, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIGS. 1-4, integrated nano-cavity plasmonic laser light sources 100, 200, 300, 400 are shown in accordance with the present principles. The laser light sources 100, 200, 300, 400 confine light at a sub-wavelength scale far below Rayleigh's diffraction limit of light, by storing some of the light energy through electron oscillations called surface plasmon polaritons. Due to surface plasmon excitations, the laser light sources 100, 200, 300, 400 may be referred to as Surface Plasmon Amplification by Stimulated Emission of Radiation or Spasers.

Referring to FIG. 1, a square cavity integrated nano-cavity plasmonic laser light source 100 is shown in accordance with one embodiment. The laser 100 includes a periodic quantum well (QW) arrangement or structure 102 sandwiched between top 104 and bottom 106 buffer/contact layers. In one embodiment, the QW arrangement 102 includes GaAs QWs with alternating layers of different GaAs materials (e.g., AlGaAs and GaAs). The alternating layers may number between, e.g., 10 and 100 and include a relationship with the wavelength of generated light to achieve light amplification. In one embodiment, the QW 102 (or multiple quantum well (MQW)) active regions may include alternating layers of, e.g., 10 nm GaAs/10 nm AlGaAs ($Al_{0.3}$, $Ga_{0.7}As$).

The buffer layers 104 and 106 may include a material such as $Al_{0.3}Ga_{0.7}As$, although other compositions and materials may be employed. Instead of or in addition to the buffer layers 104 and 106, highly doped contact layers (104, 106) may be formed. The top contact layer 104 may be inserted between the QW 102 and a plasmonic metal 108 serving as a top ohmic contact layer for the electrically pumped laser/diode. The contact layer 104 may be, e.g., 20 nm thick and may include highly doped GaAs. A second electrode (106 or connected to layer 106) can be formed using a bottom n+ doped layer or a side contact may be employed (e.g., for the oxide bonded device). A thin highly doped layer for contact 106 is employed for making the bottom side contact (106).

The QW arrangement 102 includes III-V gain materials (e.g., GaAs QWs) having a plasmonic metal 108 formed on top. The metal 108 may include, e.g., Au, although other metals may be employed (e.g., Cu, Ag, Al, etc.). The light generated in the QW arrangement 102 causes plasmonic activity in the plasmonic material 108 to excite electrons in the metal 108. The source 100 generates light using the plasmonic/photonic properties of the device to produce light (as a laser or light emitting diode (LED)).

The metal 108 may include a thickness of between about 50 nm to about 300 nm. The metal 108 may also provide heat sink properties to reduce the operating temperature of the device 100. The plasmonic metal 108 preferably includes a dielectrically-loaded surface plasmon polariton (DLSPP) mode.

The nano-cavities of the QW arrangement 102 are formed on a substrate 110. The laser 100 may be bonded on $SiO_2$/Si (110) or monolithically grown on a GaAs substrate (110). In one embodiment, the Si substrate 110 is compatible with CMOS processing. The substrate 110 may include field effect transistors 112 or other devices previously formed thereon. In one embodiment, the square cavity integrated nano-cavity plasmonic light source 100 may include a 250 nm×250 nm footprint.

Referring to FIG. 2, a square cavity integrated nano-cavity plasmonic laser light source 200 is shown in accordance with another embodiment. The laser 200 includes a periodic quantum well (QW) arrangement 102 sandwiched between top 104 and bottom 106 buffer/contact layers. The QW arrangement 102 includes III-V gain materials (e.g., GaAs QWs) having a metal 108 formed on top. The laser 200 may be bonded on $SiO_2$/Si (110) or monolithically grown on a GaAs substrate (110). In one embodiment, the square cavity integrated nano-cavity plasmonic laser light source 200 may include a 250 nm×250 nm footprint of cavity size. The QW arrangement 102 includes III-V gain materials (e.g., GaAs QWs) having the metal 108 formed on top.

In this embodiment, a bus waveguide 202 may be formed adjacent to the square cavity laser 200. The square cavity laser 200 may be spaced apart from the waveguide 202 (by length 1) or the square cavity laser 200 may formed in contact with the waveguide 202. The bus waveguide 202 may include any suitable propagation material. In one embodiment, the bus waveguide 202 includes AlGaAs (e.g., $Al_{0.3}Ga_{0.7}As$). In other embodiments, SiNx may be employed for the bus waveguide 202.

Referring to FIG. 3, a square cavity integrated nano-cavity plasmonic laser light source 300 is shown in accordance with another embodiment. The laser 300 includes a periodic quantum well (QW) arrangement 102 sandwiched between top 104 and bottom 106 buffer/contact layers. The QW arrangement 102 includes III-V gain materials (e.g., GaAs QWs) having the metal 108 formed on top. The laser 300 may be bonded on $SiO_2$/Si (110) or monolithically grown on a GaAs substrate (110). In one embodiment, the square cavity integrated nano-cavity plasmonic laser light source 300 may include a 250 nm×250 nm footprint of cavity size.

In this embodiment, the square cavity integrated nano-cavity plasmonic laser light source 300 is placed in-line with a bus waveguide 302 that may be formed prior to the square cavity laser 300. The square cavity laser 300 may be placed with the waveguide 302 on the substrate 110. The bus waveguide 302 may include any suitable propagation material. In one embodiment, the bus waveguide 302 includes AlGaAs (e.g., $Al_{0.3}Ga_{0.7}As$). In other embodiments, SiNx may be employed for the bus waveguide 302.

Referring to FIG. 4, a square cavity integrated nano-cavity plasmonic laser light source 400 is shown in accordance with another embodiment. The laser 400 includes a periodic quantum well (QW) arrangement 102 sandwiched between top 104 and bottom 106 buffer/contact layers. The QW arrangement 102 includes III-V gain materials (e.g., GaAs QWs) having a metal 408 formed on top. The laser 400 may be bonded on $SiO_2$/Si (110) or monolithically grown on a GaAs substrate (110). In one embodiment, the square cavity integrated nano-cavity plasmonic laser light source 400 may include a 250 nm×250 nm footprint of cavity size.

In this embodiment, the square cavity integrated nano-cavity plasmonic laser light source 400 is placed in-line with a bus waveguide 402 that may be formed prior to the square cavity laser 400. The square cavity laser 400 may be placed with the waveguide 402 on the substrate 110. The bus waveguide 402 may include any suitable propagation material. In one embodiment, the bus waveguide 402 includes AlGaAs (e.g., $Al_{0.3}Ga_{0.7}As$). In other embodiments, SiNx may be employed for the bus waveguide 402.

The metal 408 extends transversely to the bus waveguide 402 and extends at least a dimension (e.g., 50-500 nm) on one side of the waveguide 402. The metal 408 may extend on both sides of the waveguide 402. The metal 408 may include, e.g., Au, although other metals may be employed (e.g., Cu, Ag, Al, etc.). The larger size of the metal 408 may couple additional light into the waveguide 402 and provides additional heat sink properties.

Referring to FIG. 5, the square cavity integrated nano-cavity plasmonic laser light sources 100, 200, 300, 400 are formed in a same process flow in accordance with illustrative embodiments. GaAs/AlGaAs quantum wells 102 are first grown on GaAs substrate (not shown). The quantum wells 102 are formed to a height, H. Buffer/contact layers 104 and 106 is also formed. The epitaxial surface of the GaAs wafer is bonded to a Si substrate (or other substrate) 110 through oxide wafer bonding on oxide 502, e.g., $SiO_2$. This includes a transfer process. The original GaAs substrate has an oxide formed thereon that interface with oxide 502. The GaAs substrate is then removed before forming the metal 108 on the buffer layer 104. The GaAs substrate is selectively removed by chemical etching.

After transfer to a Si substrate 510, the device mesa may be patterned to form a square with dimension, W. A second electrode or contact (or side contact) may be formed. A waveguide (not shown) is deposited and patterned (defined) on the new substrate 510. In one embodiment, W=250 nm, although other sizes are contemplated. A plasmonic mode in the cavity 102 converts emission into propagating waveguide modes beyond the confinement of the cavity region, and a mode size of the cavity is below the diffraction limit. Light leaks into the waveguide at the edges of the cavity. A high coupling efficiency (up to, e.g., 60%) occurs when H is about 260 nm. This may be larger for thicker devices lasers, and other coupling efficiencies may be achieved.

Referring to FIG. 6, mode intensity profiles 602, 604, 606 and 608 for square and in-line square plasmonic lasers are shown in accordance with the present embodiments. Profiles 602 and 604 show the mode intensity profile for a square. A dotted box in the profiles 602 and 604 shows the location of the square cavity, relative to light intensity $E_{xy}$ in profile 602 and light intensity $E_{xz}$ in profile 604.

Profiles 606 and 608 show the mode intensity profile for a square in-line with a waveguide. Light intensity $E_{xy}$ is shown in profile 606, and light intensity $E_{xz}$ is shown in profile 608.

The profiles 602, 604, 606, 608 show mode confinement through total internal reflection at the cavity boundaries. Sub-wavelength diffraction is limited in an optical cavity mode of ~0.9 $(\lambda/2n)^3$, where n is the refraction index of cavity material and $\lambda$ is the wavelength of light.

In accordance with the present principles, Q factor, Purcell factor and coupling efficiency were measured with respect to cavity thickness (H in nm). Q factor varied between 36 and 45 at ~850 nm. Q factor was highest for the square cavity, and lowest for the in-line cavity with a metal extension. The thickness of the cavity (H) was varied up to 300 nm.

Purcell factors were reasonable high to enhance light-matter interaction. The thickness of the cavity (H) was varied between 50 nm and 350 nm. The coupling efficiency to waveguides was up to ~60% coupling efficiency. While the test results show a high performance plasmonic laser structures, the results of these measurements are not limiting.

The laser output yields high spontaneous emission factor (beta=0.55). This indicates high photon utilization of the plasmonic cavity. Power outputs may include 400 microWatts at current equal to twice the threshold current but can be larger (e.g., greater than 3 milliWatts at 10 times the threshold current). At threshold current and 3 dB bandwidth, the operating frequency exceeded 50 GHz, and approached 100 GHz at two times the threshold current (at 3 dB bandwidth).

The light sources in accordance with the present principles can operate in either the light emitting diode (LED) region or the laser region. The light sources in accordance with the present principles provide sufficient (tens of microwatts, e.g., 5 to 60 microwatts) output power for short-range optical links, and greater than 80 GHz modulation speed. This significantly exceeds the modulation speed of conventional lasers.

Figure 7:
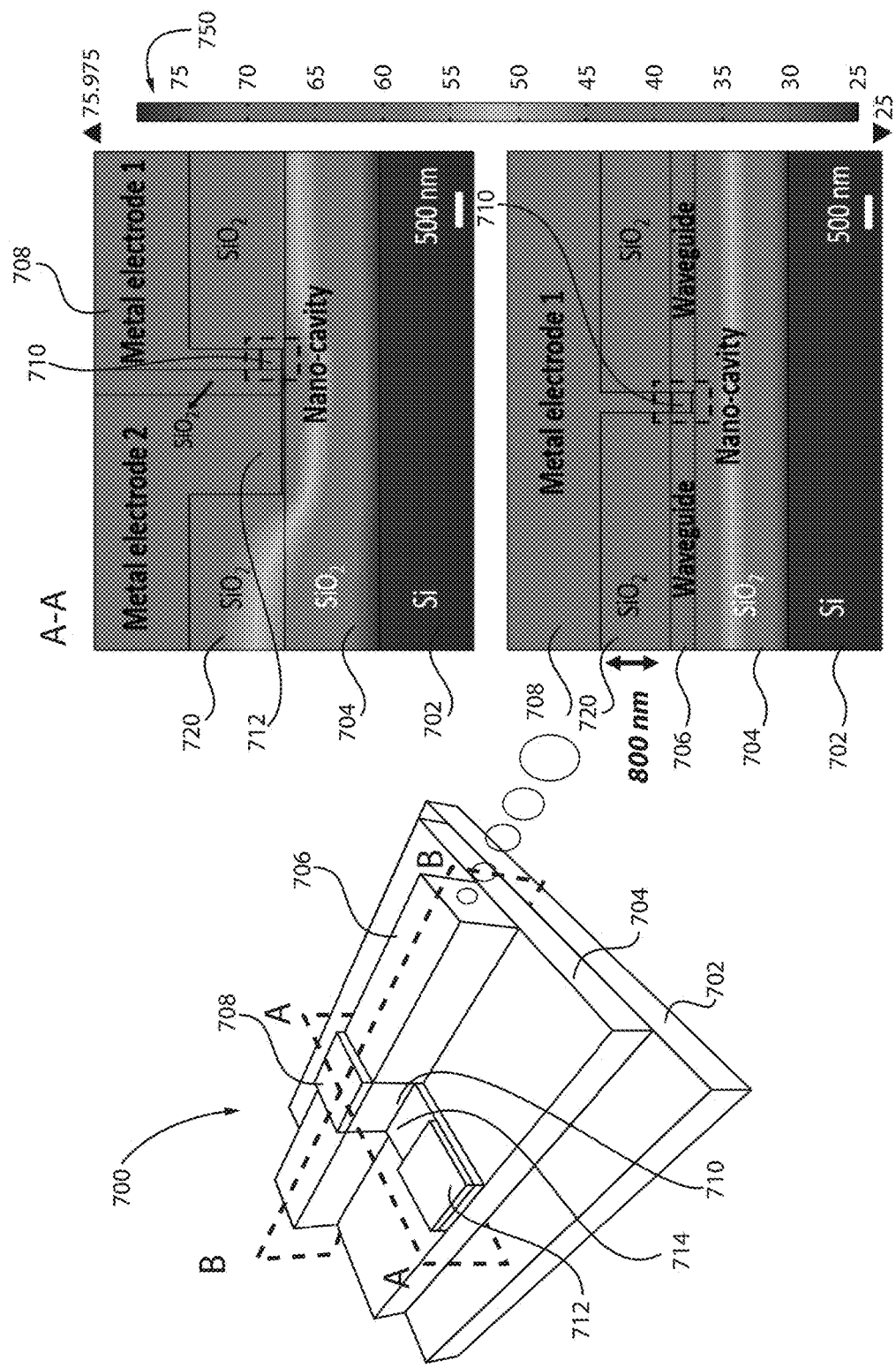
FIG. 7 shows a perspective view of a nano-laser and two cross-section views taken as section planes A-A and B-B showing temperature profiles of the nano-laser in accordance with the present principles.

Referring to FIG. 7, an electrically pumped nano-laser 700 is illustratively depicted. The nano-laser 700 was modeled, and a heat transfer analysis was conducted as depicted in sections A-A and B-B taken at section planes A-A and B-B through nano-laser 700. The nano-laser 700 is not to scale with sections A-A and B-B. The nano-laser 700 includes a Si substrate 702 and a SiO$_2$ layer 704 formed on the substrate 702. The nano-laser 700 includes an in-line square nano-cavity 710, which includes GaAs quantum wells as described above. A plasmonic metal 708 (metal electrode 1) is formed on the nano-cavity 710. The nano-cavity 710 is formed in-line with an AlGaAs waveguide 706. A second metal electrode 712 (metal electrode 2) is also coupled to the nano-cavity 710 by a buffer/contact layer 714 or other conductive path to the nano-cavity 710. The electrodes 708 and 712 may include Au, Cu, Al, Ag or other suitable metals. A dielectric layer (e.g., SiO$_2$) 720 may be employed to cover the device 710, the waveguide 706, etc. The dielectric layer 720 in this example, may include a thickness of about 800 nm. This larger thickness and material were employed in the heat transfer analysis to present a worst case-like scenario.

In accordance with the present principles, the plasmonic metal 708 serves as a heat sink, and provides greater heat dissipation. In accordance with the present principles, the nano-laser 700 can operate at ~65° C. at pump threshold (~2000 µA). This is below CMOS temperature budgets (e.g., less than 350 K), and is therefore compatible with CMOS devices formed on the same chip. In addition, a temperature scale 750 shows all temperatures below a maximum temperature of 76° C.

The use of the Si substrate 702, the temperature of operation of the nano-laser 700, the use of materials compatible with CMOS processing (e.g., Cu), etc. permits the placement of the lights sources (e.g., light sources 100, 200, 300, 400) on a chip or substrate with CMOS devices. In addition to CMOS compatibility, the integrated plasmonic square cavity laser provides enhanced modulation speed, reduced foot print, increased light coupling efficiency into a waveguide, among other advantages. The plasmonic square cavity laser is fabricated with high speed III-V materials, but is employed on a Si substrate where CMOS devices are fabricated.

Figure 8:
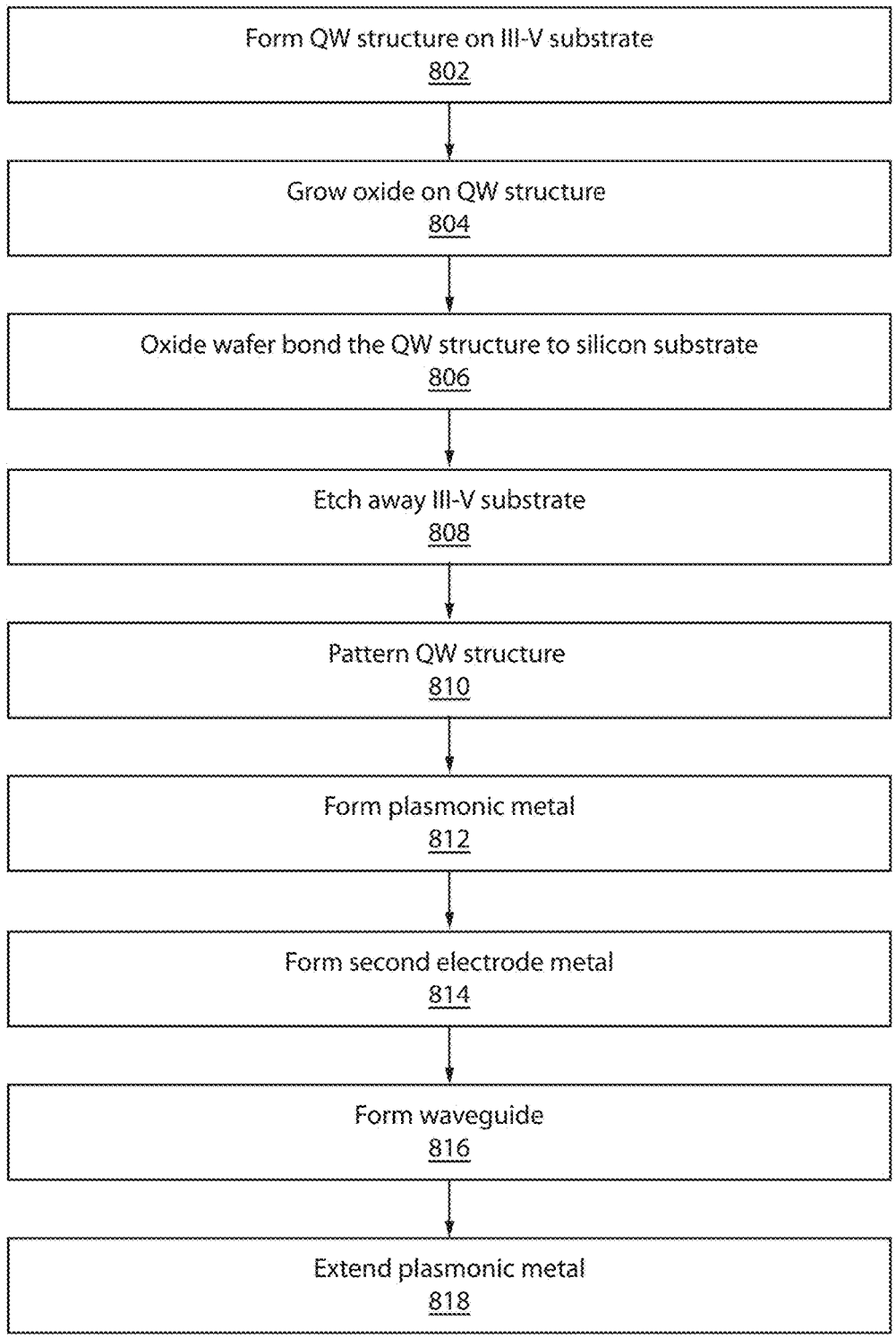
FIG. 8 is a block/flow diagram showing a method for forming a plasmonic light source in accordance with illustrative embodiments.

Referring to FIG. 8, a method for forming an on-chip plasmonic light source is illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 802, a quantum well (QW) structure is formed on a III-V substrate. The quantum well structure preferably includes III-V materials such as GaAs/AlGaAs in alternating layers. The quantum well structure may also be sandwiched between buffers/contact layers. The quantum well structure is employed with a plasmonic metal atop to generate surface plasmons to produce light. The quantum well structure is formed as a sheet at this point in the processing.

In block 804, an oxide is grown or deposited on the quantum well structure (e.g., on a buffer layer). The oxide may include silicon oxide. In block 806, the oxide on the quantum well structure is oxide wafer bonded (by flipping the quantum well structure) to an oxide formed on a silicon substrate (or other substrate material) by oxide wafer bonding. The silicon substrate may include complementary metal oxide semiconductor (CMOS) devices formed thereon.

In block 808, the III-V substrate is etched away by a selective chemical etch process. This transfers the quantum well structure to the silicon substrate to provide an on-chip light source integrated with CMOS devices formed on the silicon substrate. In block 810, the quantum well structure is patterned (e.g., by lithographic processing) to form one or more square nano-cavity light sources on the silicon substrate. A connection to the bottom of the QW structure may also be performed.

In block 812, a plasmonic metal is formed as an electrode on the square nano-cavity light source. The plasmonic metal may be formed before transferring the quantum well structure or may be formed after the transfer to the substrate and patterned (in block 814) along with the quantum well structure or formed and patterned separately from the quantum well structure.

In block 814, the quantum well structure may be patterned to extend a buffer layer so that a second electrode can be formed to contact a bottom of the quantum well structure. A second electrode may be formed on or with the buffer layer or may be formed on a side of the quantum well structure.

In block 816, a waveguide is formed on the silicon substrate. The waveguide may be disposed adjacent to and/or spaced apart from the square nano-cavity, or the waveguide may be formed with the square nano-cavity light source being disposed in-line within the waveguide.

In block 818, the plasmonic metal is disposed transversely to a longitudinal direction of the waveguide and extends beyond the square nano-cavity and the waveguide on at least one side of the nano-cavity and the waveguide. This may be performed by depositing a dummy material, depositing the plasmonic metal and then removing the dummy material. The plasmonic metal may be deposited and patterned in many different process sequences. Processing continues as needed.

Having described preferred embodiments plasmonic mode III-V laser as on-chip light source (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A plasmonic light source, comprising:
   a nano-cavity quantum well structure including III-V materials disposed on a contact layer formed on a complementary metal oxide semiconductor (CMOS) substrate; and
   a plasmonic metal formed as an electrode on the nano-cavity and configured to excite surface plasmons with the quantum well structure to generate light to form a nano-cavity light source with low parasitic capacitance.

2. The light source as recited in claim 1, further comprising a waveguide disposed adjacent to and spaced apart from the nano-cavity and configured to couple plasmonic light from the nano-cavity.

3. The light source as recited in claim 1, further comprising a waveguide and the nano-cavity being disposed in-line within the waveguide and configured to couple plasmonic light from the nano-cavity.

4. The light source as recited in claim 3, wherein the plasmonic metal is disposed transversely to a longitudinal direction of the waveguide and extends beyond the nano-cavity and the waveguide on at least one side of the nano-cavity and the waveguide.

5. The light source as recited in claim 1, wherein the quantum well structure is sandwiched between buffer layers.

6. The light source as recited in claim 1, wherein the plasmonic metal is compatible with CMOS processing.

7. The light source as recited in claim 1, wherein the plasmonic light source includes an operating temperature compatible with the CMOS devices on a same chip.

8. The light source as recited in claim 1, wherein the plasmonic light source includes one of a laser or a light emitting diode.

9. The light source as recited in claim 1, wherein the nano-cavity include a square shape in a top down view.

10. A method for forming an on-chip plasmonic light source, comprising:
    oxide wafer bonding a quantum well structure formed on a III-V substrate with an oxide formed on a silicon substrate;
    removing the III-V substrate to transfer the quantum well structure to the silicon substrate; and
    forming a plasmonic metal as an electrode on the quantum well structure to form a nano-cavity light source.

11. The method as recited in claim 10, further comprising forming a waveguide disposed adjacent to and spaced apart from the nano-cavity.

12. The method as recited in claim 11, further comprising forming a waveguide with the nano-cavity light source being disposed in-line within the waveguide.

13. The method as recited in claim 12, wherein the plasmonic metal is disposed transversely to a longitudinal direction of the waveguide and extends beyond the nano-cavity and the waveguide on at least one side of the nano-cavity and the waveguide.

14. The method as recited in claim 10, further comprising patterning the quantum well structure to form a square nano-cavity light source on the silicon substrate.

15. The light source as recited in claim 1, further including an oxide formed on the quantum well structure and oxide wafer bonded to the substrate.

16. The light source as recited in claim 5, wherein a bottom buffer layer of the buffer layers includes a portion extending beyond the quantum well structure and has an electrode formed on the portion.

17. The light source as recited in claim 5, wherein a top buffer layer of the buffer layers operates as a contact layer to provide a conductive path between the plasmonic metal and the quantum well structure.

18. The method as recited in claim 10, further including forming a top buffer layer on the quantum well structure to provide a contact layer as a conductive path between the plasmonic metal and the quantum well structure.

19. The method as recited in claim 10, further including forming a bottom buffer layer on the quantum well structure between the quantum well structure and the silicon substrate.

20. The method as recited in claim 19, wherein the bottom buffer layer includes a portion extending beyond the quantum well structure and has an electrode formed on the portion.

* * * * *